(12) United States Patent
Arai

(10) Patent No.: US 8,039,936 B2
(45) Date of Patent: Oct. 18, 2011

(54) SEMICONDUCTOR DEVICE

(75) Inventor: Kiyoshi Arai, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 265 days.

(21) Appl. No.: 12/251,845

(22) Filed: Oct. 15, 2008

(65) Prior Publication Data

US 2009/0315613 A1    Dec. 24, 2009

(30) Foreign Application Priority Data

Jun. 20, 2008  (JP) .................... 2008-161845

(51) Int. Cl.
*H01L 23/02* (2006.01)

(52) U.S. Cl. .. 257/678; 257/690; 257/691; 257/E23.079

(58) Field of Classification Search ............. 257/107, 257/177, 178, E23.001–E23.194, E23.01, 257/678–733, 787–796

See application file for complete search history.

(56) References Cited

U.S. PATENT DOCUMENTS

| | | | | |
|---|---|---|---|---|
| 6,995,461 B2 * | 2/2006 | Soyano et al. | ............ | 257/678 |
| 7,019,390 B2 * | 3/2006 | Sheng et al. | ............ | 257/678 |
| 7,187,074 B2 * | 3/2007 | Uchiyama et al. | ............ | 257/706 |
| 2005/0134357 A1 * | 6/2005 | Fedigan | ............ | 327/365 |

FOREIGN PATENT DOCUMENTS

| | | |
|---|---|---|
| DE | 2 224 393 | 11/1972 |
| DE | 102 17 580 A1 | 11/2003 |
| DE | 10 2007 042 444 A1 | 3/2009 |
| DE | 10 2008 052 029 A1 | 6/2009 |
| JP | 5-145007 A | 6/1993 |
| JP | 6-140996 | 5/1994 |
| JP | 7-273685 | 10/1995 |
| JP | 8-186630 | 7/1996 |
| JP | 8-236696 A | 9/1996 |
| JP | 11-68033 A | 3/1999 |
| JP | 11-164483 A | 6/1999 |
| JP | 2000-20665 | 1/2000 |
| JP | 2001-110658 | 4/2001 |
| JP | 2003-218315 A | 7/2003 |
| JP | 2004-87871 | 3/2004 |
| JP | 2005-203657 A | 7/2005 |
| JP | 2005-260765 | 9/2005 |
| JP | 2006-324525 | 11/2006 |
| JP | 2006-333328 | 12/2006 |
| JP | 2007-12041 | 1/2007 |
| JP | 2008-112828 A | 5/2008 |
| WO | WO 2007/029435 A1 | 3/2007 |

OTHER PUBLICATIONS

German Office Action issued Dec. 27, 2011, in German Patent Application No. 10 2008 054 307.1-33 with English translation.
Office Action issued Mar. 15, 2011 in Japan Application No. 2008-161845 (With English Translation).

* cited by examiner

*Primary Examiner* — Jasmine Clark

(74) *Attorney, Agent, or Firm* — Oblon, Spivak, McClelland, Maier & Neustadt, L.L.P.

(57) ABSTRACT

A semiconductor device includes a semiconductor element and a connector. The semiconductor element has a power device of a voltage drive type for controlling an on operation and an off operation of a main current by input of a drive signal. The connector receives the drive signal without making contact with an issuing unit issuing the drive signal, and transmits the drive signal to the semiconductor element. The semiconductor element preferably includes a control unit for converting the drive signal received by the connector into a voltage value, and transmitting the voltage value to the semiconductor element.

6 Claims, 3 Drawing Sheets

SEMICONDUCTOR DEVICE

BACKGROUND OF THE INVENTION

1. Field of the Invention

The invention relates to a semiconductor device, and particularly to a semiconductor device having a power device of a voltage drive type.

2. Description of the Background Art

In general, a semiconductor device having a semiconductor element is connected to an external system side via a main electrode and a signal terminal. The main electrode passes a main current to the semiconductor element in an on operation or an off operation. A drive signal (gate drive signal) is transmitted from the system side to the signal terminal for causing the semiconductor device to perform the on operation or the off operation. This drive signal is transmitted as a voltage from the system side such as an inverter.

As an example of the above semiconductor device, Japanese Patent Laying-Open No. 2004-087871 (Patent Document 1) has disclosed a temperature sensing device of a semiconductor switch element. This patent document 1 has disclosed a temperature sensor, a non-contact temperature transmitting device and a power supply circuit. The temperature sensor senses a temperature in a desired position of the semiconductor switch element. The non-contact temperature transmitting device transmits, in a non-contact manner, a sensed temperature value obtained by the temperature sensor that is attached to the semiconductor switch element to a position remote from the semiconductor switch element. The power supply circuit uses, as a power supply, a gate signal provided to the semiconductor switch element, and supplies an operation power to the temperature sensor and the non-contact temperature transmitting device.

Japanese Patent Laying-Open No. 2006-324525 (Patent Document 2) has disclosed a method of signal transmissions between chips (semiconductor elements). The patent document 2 has disclosed the signal transmission method in which a second inductor element receives a first signal issued from a first inductor element and outputs it as a second signal, and particularly has disclosed the method in which the second inductor element receives the first signal and outputs the received signal by electromagnetic induction. The chip has a gate electrode that is driven by a pulse (drive signal) generated by a pulse generating circuit.

Japanese Patent Laying-Open No. 2000-020665 (Patent Document 3) has disclosed a semiconductor device provided with an LSI chip and an antenna. According to the disclosure of the patent document 3, the antenna receiving an electromagnetic wave generates an electric power by electromagnetic induction, and supplies it to an LSI chip (semiconductor element) so that the LSI chip operates, According to the patent documents 1 to 3, a drive signal terminal for transmitting the drive signal to the semiconductor element inside the device must be electrically connected to a signal issuing unit on the system side. The semiconductor devices have been used in extremely wide ranges, and it is important to ensure reliability of electric connection between the system side and the semiconductor device.

The foregoing patent documents have not disclosed the electric connection between the drive signal issuing unit on the system side and the drive signal terminal of the semiconductor device described above. For example, the following three techniques may be employed for the electric connection between the drive signal issuing unit and the drive signal terminal. In a first technique, the drive signal terminal is joined to the drive signal issuing unit by solder. In a second technique, a connector is used, and the signal terminal is electrically connected to the drive signal issuing unit by a frictional force of the connector. In a third technique, a spring is used, and the drive signal terminal is electrically connected to the drive signal issuing unit by a pressing force applied to a surface.

However, the electric connection by the solder in the first technique suffers from the following problem. In recent years, lead-free solder has been used in view of environment. The lead-free solder generally has a high melting point. Therefore, a heat that is applied for soldering the drive signal issuing unit to the drive signal terminal is liable to damage at least one of the drive signal issuing unit and the signal terminal. This lowers the reliability of the semiconductor device.

When a stress is applied to a joined portion of the solder, e.g., due to vibrations, a crack or the like may occur. This lowers the reliability of the electric connection between the signal issuing unit and the drive signal terminal. When the reliability of the electric connection between the signal issuing unit and the drive signal terminal lowers, the drive signal cannot be transmitted reliably to the semiconductor device.

The electric connections by the connector or the spring in the foregoing second and third techniques suffer from the following problem. When a stress, e.g., due to vibrations is applied, the state of contact between the drive signal terminal and the drive signal issuing unit changes. Thereby, the drive signal issuing unit may be electrically disconnected from the drive signal terminal, which lowers the reliability of electric connection between the drive signal issuing unit and the drive signal terminal. Consequently, the drive signal cannot be transmitted reliably to the semiconductor element.

SUMMARY OF THE INVENTION

Accordingly, an object of the invention is to provide a semiconductor device that improves reliability of transmitting a drive signal to a semiconductor element.

A semiconductor device according to the invention includes a semiconductor element and a drive signal terminal. The semiconductor element has a power device of a voltage drive type for controlling an on operation and an off operation of a main current by input of a drive signal. The drive signal terminal receives the drive signal without making contact with an issuing unit issuing the drive signal, and transmits the drive signal to the semiconductor element.

The semiconductor device of the invention has the power device of the voltage drive type. This power device of the voltage drive type receives the drive signal from a system side outside the semiconductor device, and thereby the on operation and the off operation of the power device of the voltage drive type are controlled. Since the drive signal is weak, a use environment such as small vibrations is liable to affect the drive signal if the connection is performed by the spring force or the like without using the solder. In the invention, the issuing unit that issues the drive signal on the system side is not in contact with the drive signal terminal when the drive signal is transmitted. This suppresses an influence that may be applied from the use environment of the semiconductor device to the electric connection between the issuing unit and the drive signal terminal. Accordingly, the reliability of the electric connection between the signal issuing unit and the drive signal terminal can be improved.

The issuing unit is electrically connected to the drive signal terminal without applying a heat to the issuing unit and the drive signal terminal. Accordingly, the reliability of the issuing unit and the drive signal terminal is high.

For the above reasons, the reliability of transmission of the drive signal to the semiconductor device can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

First Embodiment

Figure 1:
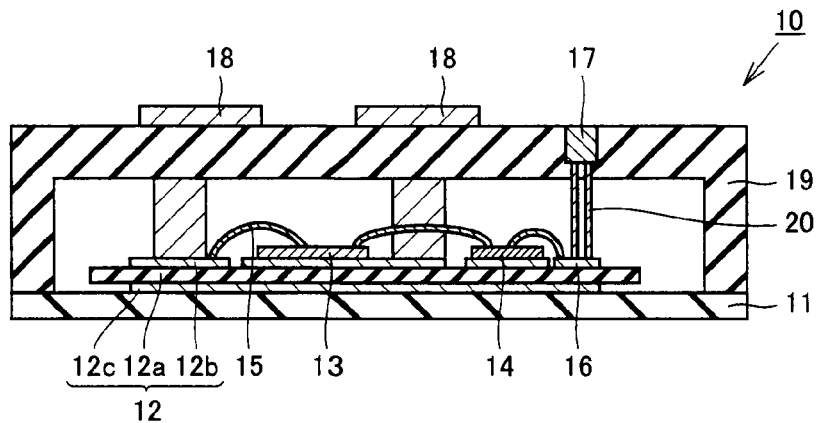
FIG. 1 is a cross section schematically showing a semiconductor device of a first embodiment of the invention.

First, a structure of a semiconductor device of an embodiment will be described below. Referring to FIG. 1, a semiconductor device 10 includes a base member 11, a substrate 12, a semiconductor element 13, a control element 14 serving as a control unit, a wire 15, a connector connection pattern 16, a connector 17 serving as a drive signal terminal, electrodes 18, a casing 19 and a connection unit 20.

Base member 11 has a heat radiation property. Casing 19 is connected to base member 11 to form an outer frame of semiconductor device 10. Casing 19 protects the interior of semiconductor device 10.

Substrate 12 is arranged in casing 19 and is located on base member 11. Substrate 12 includes an illustrating substrate 12a and electrically conductive patterns 12b and 12c. Patterns 12b and 12c are formed on the upper and lower surfaces of illustrating substrate 12a, respectively.

Semiconductor element 13 is arranged on pattern 12b on the upper surface side of substrate 12 and, e.g., is soldered thereto. Semiconductor element 13 has a power device of a voltage drive type. When this power device of the voltage drive type externally receives a drive signal, it senses potential variations thereof and performs an on operation or an off operation. In other words, the power device of the voltage drive type performs the on or off operation when it receives a voltage, e.g., on its gate, or receives a reduced voltage. The power device is a device to be employed for switching of a device that efficiently controls an electric power by freely changing a frequency of an AC power, and an inverter is a typical example thereof. For example, an IGBT (Insulated Gate Bipolar Transistor) receiving a voltage of 600 V or more is appropriately used as the power device.

Connector 17 is formed at an upper portion of casing 19. In this embodiment, connector 17 is embedded in casing 19, and the upper surfaces of connector 17 and casing 19 are flush with each other.

Connector 17 is arranged such that it is not in contact with an issuing unit (not shown) such as a connector on the system side that issues a drive signal. Connector 17 receives the drive signal without being in contact with the issuing unit issuing the drive signal, and transmits the received drive signal to semiconductor element 13.

Preferably, connector 17 includes, e.g., a coil or a hole element, and receives the drive signal by electromagnetic induction using the coil.

Electrically conductive connector connection pattern 16 is formed on substrate 12, and is electrically connected to connector 17 via connection unit 20.

Control element 14 is formed on pattern 12b on the upper surface side of substrate 12. Control element 14 is electrically connected to connector connection pattern 16 via wire 15, and is electrically connected to semiconductor element 13 via wire 15. Although this embodiment employs the wire for the electric connection, this is not restrictive and, e.g., a bump connection may be employed. Control element 14 converts the drive signal received by connector 17 into an appropriate value, and transmits it to semiconductor element 13. The appropriate voltage value is a voltage value that is appropriate for driving by semiconductor element 13. For this conversion into the appropriate voltage value, control element 14 includes, e.g., a sensing circuit.

Electrode 18 is connected to pattern 12b of substrate 12. Thus, electrode 18 is electrically connected to semiconductor element 13 via pattern 12b. Electrode 18 passes a main current to semiconductor element 13. The upper surface of element 18 is located in a higher position than casing 19. Thus, when semiconductor element 13 is placed on substrate 12 located in the horizontal position, the upper surface of connector 17 is located lower than the upper surface of electrode 18.

Semiconductor device 10 may further include a control circuit (not shown) for causing semiconductor element 13 to continue the on or off operation until a drive signal is received after semiconductor element 13 started the on or off operation. Preferably, this control circuit has a function of detecting the input signal even when the input signal is zero.

Then, the operations of semiconductor device 10 in the embodiment will be described.

First, the on operation of semiconductor device 10 will be described.

When the issuing unit such as a connector on the system side that issues the drive signal provides an on signal, e.g., of about +15 V as the drive signal, connector 17 issues a potential. When connector 17 includes a coil, the electromagnetic induction issues the potential. This potential is transmitted via connection unit 20 to connector connection pattern 16, and then is transmitted from connector connection pattern 16 via wire 15 to control element 14. When the potential issued by the electromagnetic induction is small, in order to suppress malfunction, control element 14 converts it into a voltage value allowing appropriate driving of semiconductor element 13, using a sensing circuit or the like. The voltage value thus converted is transmitted to semiconductor element 13 via wire 15. Thereby, the drive signal causing the on operation is transmitted to semiconductor element 13 so that semiconductor element 13 performs the on operation to pass the main current between electrodes 18. Thereafter, the on operation continues until the control circuit or the like provides a next signal to semiconductor element 13.

Then, the off operation of semiconductor device 10 will be described.

When the issuing unit issuing the drive signal such as the connector on the system side provides, as the drive signal, the off signal of 0 V or about −10 V, connector 17 issues a potential. When connector 17 includes a coil, the issued potential is opposite in direction to that issued when the on signal is received. This potential is transmitted to control element 14 via connection unit 20, connector connection pattern 16 and wire 15 as described above. Control element 14 converts the potential thus transmitted into the voltage value that allows appropriate operation of semiconductor element 13. By transmitting this voltage value to semiconductor element 13 via wire 15, semiconductor element 13 performs the off operation to interrupt the main current flowing between electrodes 18. Thereafter, the off operation continues until the control circuit or the like transmits the next signal to semiconductor element 13. Preferably, this control circuit holds the voltage applied to semiconductor element 13 at 0 V or about −10 V when the device is starting up or is not operating.

Subsequently, the operation and effect of the semiconductor device of this embodiment will be described together with a comparison example shown in FIG. 7.

Figure 7:
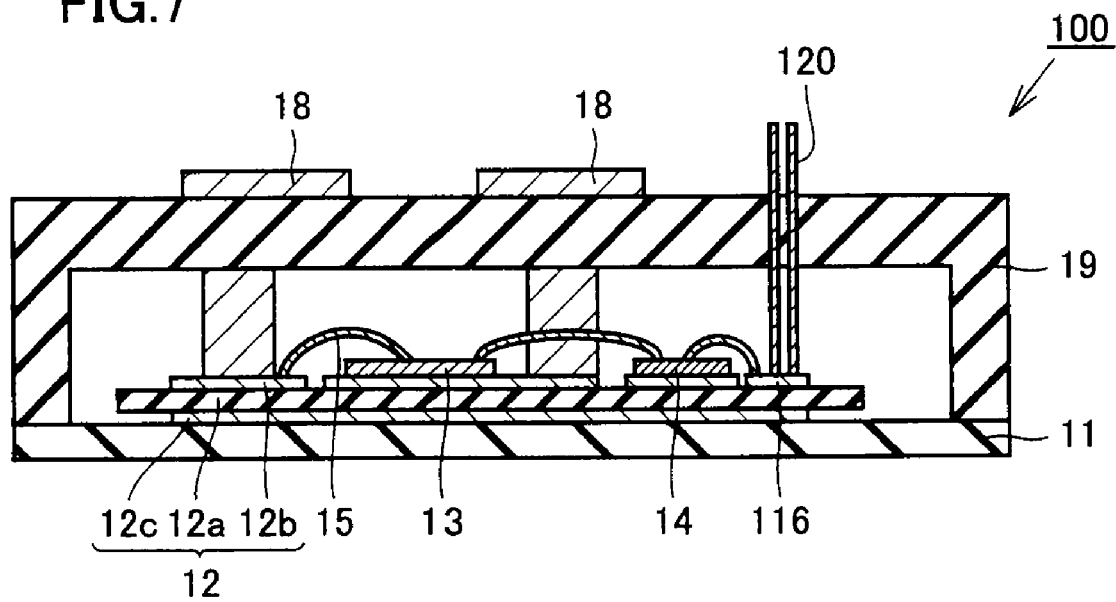
FIG. 7 is a cross section schematically showing a semiconductor device of a comparison example of the embodiment.

As shown in FIG. 7, a semiconductor device 100 of the comparison example differs from semiconductor device 10 of the embodiment in that the issuing unit issuing the drive signal such as the connector on the system side is in direct contact with semiconductor element 13.

More specifically, semiconductor device 100 of the comparison example does not include connector 17, an electrically conductive member 120 serving as the connection unit is a signal terminal that is in direct contact with a signal terminal connection pattern 116 and the issuing unit issuing the drive signal on the system side. Therefore, the drive voltage provided from the issuing unit on the system side is transmitted to semiconductor element 13 via signal terminal connection pattern 116, a wire 115, control unit 14 and wire 15.

In semiconductor device 100 of the comparison example, an electrically conductive member 120 is connected to signal terminal connection pattern 116 of semiconductor device 100, e.g., by solder, a connector or a spring. Conductive member 120 is connected to the signal issuing unit on the system side, e.g., by solder, a connector or a spring. Therefore, the foregoing problem arises so that semiconductor device 100 of the comparison example suffers from a problem that reliability of transmitting the drive signal to semiconductor element 13 is low.

When the issuing unit on the system side and signal terminal connection pattern 116 of semiconductor device 100 are joined to conductive member 120 and the signal issuing unit on the system side by the solder, and particularly when many terminals are required for transmitting the drive signal, many portions must be soldered so that many working steps are required.

When the issuing unit on the system side and signal terminal connection pattern 116 of semiconductor device 100 are connected to conductive member 120 and the signal issuing unit on the system side by the connector and the spring, a friction force may be increased for reducing an influence exerted by a use environment of the semiconductor device. However, this structure causes a problem that replacement of the connector and/or spring cannot be performed without difficulty even when it is necessary.

Semiconductor device 10 of the embodiment includes semiconductor element 13 having the power device of the voltage drive type for controlling the on and off operations of the main current by the input of the drive signal, and connector 17 that receives the drive signal without being in contact with the issuing unit issuing the drive signal, and transmits the drive signal to semiconductor element 13.

Semiconductor device 10 of the embodiment has the power device of the voltage drive type. The power device of the voltage drive type receives the drive signal from the external system side of semiconductor device 10, and thereby the on or off operation of the power device of the voltage drive type is controlled. In the power device of the voltage drive type, the drive signal received by connector 17 is weak, and the main current flowing from electrode 18 is large. Since the drive signal is generally weak, the drive signal is liable to be affected by a use environment such as small vibrations when contact connection is made, e.g., by the spring force without using the solder, and therefore it is difficult to transmit accurately the drive signal due to small vibrations. In this embodiment, however, the drive signal is transmitted in such a state that the issuing unit issuing the drive signal on the system side is not in contact with connector 17. Thereby, the electric connection between the issuing unit and connector 17 is less susceptible to the influence by the use environment of semiconductor device 10 such as vibrations. This can improve the reliability of the electric connection between the signal issuing unit and the drive signal terminal.

Heat is not applied to the issuing unit and connector 17 when electrically connecting them together. This can ensure high reliability of the issuing unit and connector 17 themselves.

Accordingly, the reliability of transmitting the drive signal to semiconductor element 13 can be improved.

Further, the power device passes a large main current through electrode 18. Therefore, electrode 18 is generally connected to an external circuit by solder, a fastener such as a screw or the like.

As described above, semiconductor device 10 of the embodiment employs the non-contact manner for transmitting the drive signal from the issuing unit on the system side to connector 17, and employs the direct contact manner for transmitting the main current from electrode 18 to semiconductor element 13. Therefore, it is possible to improve the reliability of the transmission of the drive signal to semiconductor element 13 and to supply smoothly the main current to semiconductor element 13 having the power device.

Further, the issuing unit on the system side is not in contact with connector 17, and is not joined thereto by solder. Therefore, even when many terminals require the transmission of the drive signal, the increase of the working steps can be suppressed because it is merely required to arrange non-contact connectors 17 as the terminals.

The issuing unit on the system side is not in contact with connector 17, and is not joined thereto by a connector or a spring. Therefore, when it becomes necessary to replace connector 17, only the required connector can be replaced. This improves convenience of semiconductor device 10.

Preferably, semiconductor device 10 further includes control element 14 as a control unit for converting the drive signal received by connector 17 into the voltage value and transmitting it to semiconductor element 13.

Control element 14 allows transmission of the appropriate drive voltage to semiconductor element 13. Therefore, connector 17 is not required to issue the appropriate potential for transmitting the drive signal to semiconductor element 13. Consequently, connector 17 can be small in size. Accordingly, semiconductor device 10 can be small in size.

In the semiconductor device 10 described above, connector 17 preferably receives the drive signal by electromagnetic induction.

When the issuing unit issuing the drive signal on the system side includes a coil, the electromagnetic induction by the coil produces an electromotive force, and the potential by this electromotive force can be transmitted as the drive signal to semiconductor element 13. Therefore, it is possible to implement semiconductor device 10 having connector 17 that can transmit the drive signal without making contact with the issuing unit.

Second Embodiment

Figure 2:
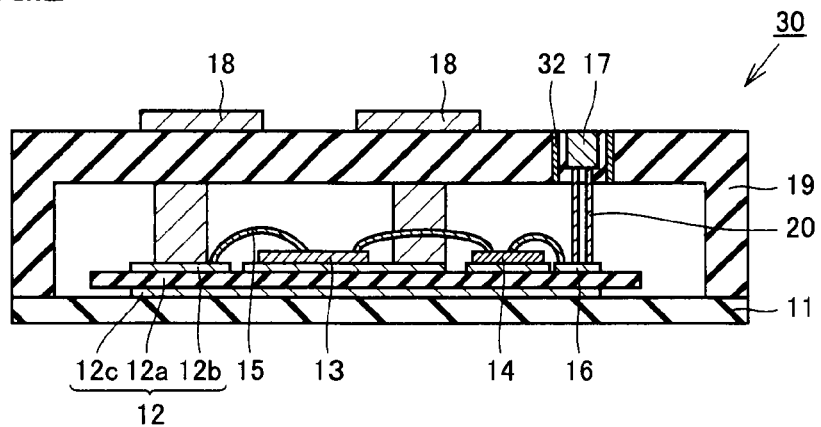
FIG. 2 is a cross section schematically showing a semiconductor device of a second embodiment of the invention.

Referring to FIG. 2, a semiconductor device 30 according to the embodiment has basically the same structure as semiconductor device 10 in the first embodiment except for that semiconductor device 30 further includes a metal member 32 arranged around a periphery of connector 17.

More specifically, metal member 32 is embedded in casing 19 and surrounds the periphery of connector 17. Metal member 32 preferably surrounds the entire periphery of connector 17. Metal member 32 may be made of gold, silver, copper or the like from the viewpoint of a high electrical conductivity, and may be made of iron, cobalt or nickel from the viewpoint of a high magnetic permeability.

Structures other than the above are substantially the same as those of the first embodiment. Therefore, the same components bear the same reference numbers, and description thereof is not repeated.

As described above, semiconductor device 30 of this embodiment further includes metal member 32 arranged around the periphery of connector 17.

A skin effect by an eddy current can be utilized so that metal member 32 serves as an electromagnetic shield for connector 17. Therefore, it is possible to suppress external leakage of the changes in magnetic flux that is induced by the electromagnetic induction in connector 17 when the drive signal is input. Accordingly, the drive signal can be transmitted more reliably to semiconductor element 13.

Third Embodiment

Figure 3:
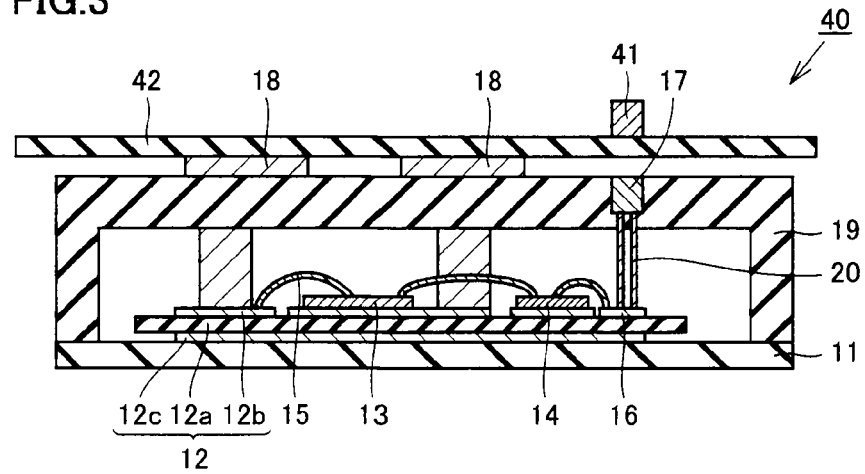
FIG. 3 is a cross section schematically showing a semiconductor device of a third embodiment of the invention.

Referring to FIG. 3, semiconductor device 40 in a third embodiment has basically the same structure as semiconductor device 10 in the first embodiment except for that semiconductor device 40 further includes a signal issuing unit 41 on the system side.

More specifically, a control substrate 42 has patterns at its upper and lower surfaces, respectively. Control substrate 42 is in contact with the upper surfaces of electrodes 18. Thus, the pattern on the lower surface of control substrate 42 is electrically connected to electrode 18. The control substrate may be made of, e.g., a printed board, and is preferably made of a power board that can pass a large current through the pattern.

Signal issuing unit 41 is arranged on control substrate 42 and is opposed to connector 17. In the state where semiconductor element 13 is placed on substrate 12, signal issuing unit 41 is spaced from connector 17 by a distance equal to a sum of a thickness of electrode 18 exposed on the casing and a thickness of control substrate 42.

Signal issuing unit 41 issues the drive signal. Signal issuing unit 41 can transmit the drive signal without making contact with connector 17.

Figure 4:
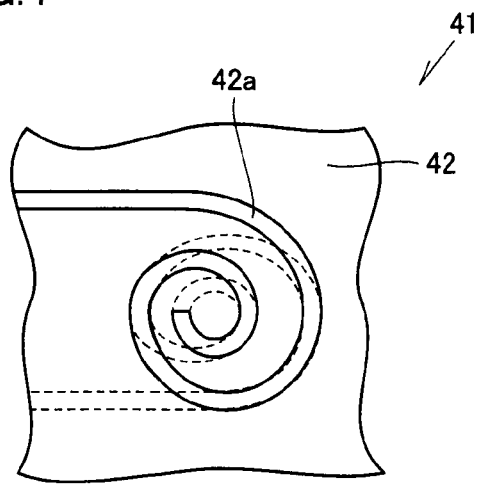
FIG. 4 is a diagram schematically showing a signal issuing unit in the third embodiment of the invention.

When connector 17 includes a coil, signal issuing unit 41 includes, e.g., a coil. Signal issuing unit 41 including the coil will now be described with reference to FIG. 4. Referring to FIG. 4, solid line represents a pattern 42a on the front surface side of control substrate 42, and dotted line represents pattern 42a on the rear side of control substrate 42. As shown in FIG. 4, pattern 42a on control substrate 42 has a spiral form. Under pattern 42a, a through hole is formed, and is filled with an electrically conductive member. Therefore, the conductive member filling the space between the upper and lower surfaces of control substrate 42 make electric connection to form a coil.

Structures other than the above are substantially the same as those of the first embodiment. Therefore, the same components bear the same reference numbers, and description thereof is not repeated.

Semiconductor device 40 according to this embodiment may employ the structures of the first or second embodiment as well as an appropriate combination of them.

As described above, semiconductor device 40 in this embodiment includes electrode 18 that is electrically connected to semiconductor element 13 for passing the main current, and the upper surface of connector 17 is located in the lower position than electrode 18.

Thereby, when control substrate 42 is arranged on electrode 18 and signal issuing unit 41 that is the connector on the system side is arranged on control substrate 42, connector 17 of semiconductor device 40 and signal issuing unit 41 that is the connector on the system side can be arranged while keeping a difference equal to the sum of the thickness of control substrate 42 and the thickness of the portion of electrode 18 projecting from casing 19. Therefore, by reducing the above difference, connector 17 of semiconductor device 40 and signal issuing unit 41 that is the connector on the system side can be arranged stably while suppressing the influence by the use environment of semiconductor device 40. Therefore, the drive signal can be transmitted more reliably to semiconductor element 13 so that the reliability of semiconductor device 40 can be improved.

Fourth Embodiment

Figure 5:
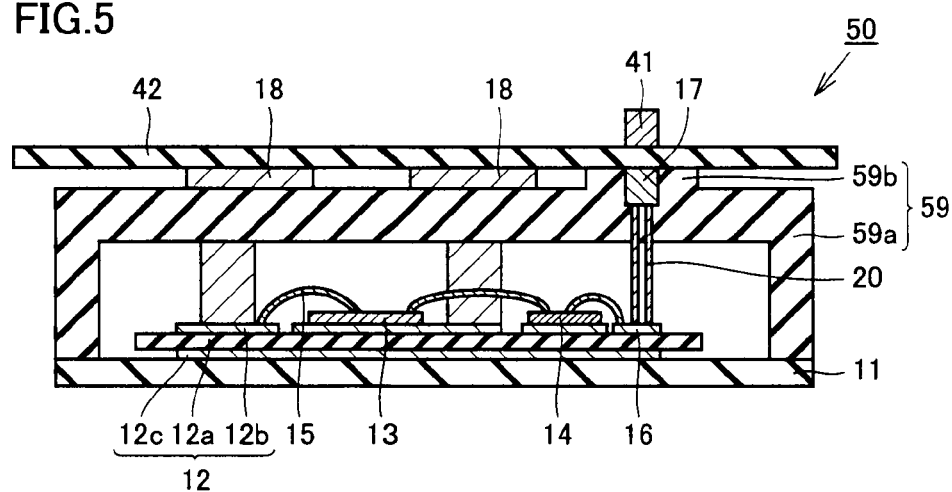
FIG. 5 is a cross section schematically showing a semiconductor device of a fourth embodiment of the invention.

Referring to FIG. 5, a semiconductor device 50 according to a fifth embodiment differs from the foregoing embodiments in that the upper surface of connector 17 is flush with the upper surface of the electrode.

More specifically, a casing 59 has a body 59a and a projection 59b projecting in a region where connector 17 is located. The upper surface of projection 59b is flush with the upper surface of electrode 18. Connector 17 is embedded in projection 59b, and the upper surface of connector 17 is exposed from projection 59b.

Control substrate 42 on the system side is arranged on electrodes 18 and projection 59b of casing 59. Signal issuing unit 41 is formed on the upper surface of control substrate 42. Therefore, in the state where semiconductor element 13 is placed on substrate 12 that is arranged in the horizontal position, the space between signal issuing unit 41 and connector 17 is kept equal to the thickness of control substrate 42.

Structures other than the above are substantially the same as those of the first embodiment. Therefore, the same components bear the same reference numbers, and description thereof is not repeated.

Semiconductor device 50 according to this embodiment may employ the structures of the first, second or third embodiment as well as an appropriate combination of them.

As described above, semiconductor device 50 of the embodiment includes electrode 18 for passing the main current, and the upper surface of connector 17 is flush with electrode 18.

In the structure where control substrate 42 on the system side is arranged on electrode 18 and connector 17, and signal issuing unit 41 on the system side is arranged on control substrate 42, connector 17 of semiconductor device 50 and signal issuing unit 41 on the system side can be arranged while keeping a difference equal to the thickness of control substrate 42. By reducing this difference, connector 17 of semiconductor device 50 can be arranged close to signal issuing unit 41 on the system side. Therefore, when the drive signal is transmitted, e.g., by the electromagnetic induction, flux leakage can be reduced so that the drive signal can be transmitted to semiconductor element 13 more reliably.

Connector 17 of semiconductor device 50 and signal issuing unit 41 on the system side can be arranged to keep a width of control substrate 42. Therefore, connector 17 of semiconductor device 50 and signal issuing unit 41 on the system side can be stably held. Accordingly, an influence of the use environment of semiconductor device 50 can be suppressed more effectively.

Accordingly, it is possible to improve the reliability of transmitting the drive signal to semiconductor element 13.

Fifth Embodiment

Figure 6:
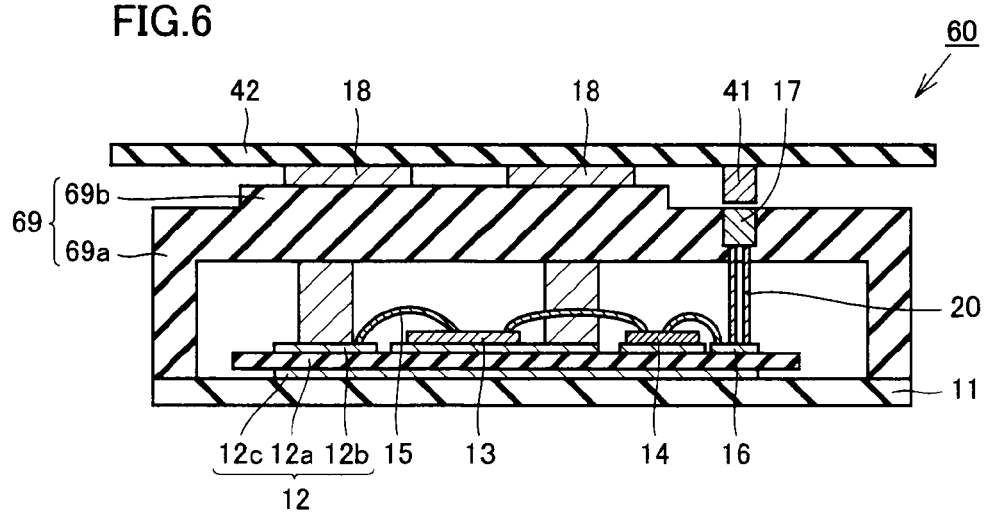
FIG. 6 is a cross section schematically showing a semiconductor device of a fifth embodiment of the invention.

Referring to FIG. 6, a semiconductor device 60 according to this embodiment differs from the embodiments already described in that the upper surface of connector 17 is located lower than the upper surface of electrode 18.

More specifically, casing 69 has a body 69a and a projection 69b projecting in a region where connector 17 is not present. Connector 17 is embedded in body 69a located in a position lower than projection 69b. The upper surface of connector 17 is exposed from body 69a. The upper surface of electrode 18 is projected from projection 69b.

Control substrate 42 on the system side is arranged on electrodes 18. Signal issuing unit 41 on the system side is arranged on the lower surface of control substrate 42 and particularly in a position that is not opposed to projection 69b but is opposed to connector 17, and is not in contact with connector 17. Therefore, in the state where semiconductor element 13 is placed on substrate 12 that is arranged in a horizontal position, the upper surface of connector 17 is located lower than electrode 18.

Structures other than the above are substantially the same as those of the first embodiment. Therefore, the same components bear the same reference numbers, and description thereof is not repeated.

Semiconductor device 60 according to this embodiment may employ the structures of one of the first to fourth embodiments as well as an appropriate combination of them.

As described above, semiconductor device 60 according to this embodiment includes electrode 18 for passing the main current, and the upper surface of connector 17 is located lower than electrode 18.

Accordingly, by arranging control substrate 42 on electrode 18 and by arranging signal issuing unit 41 under control substrate 42 with a space kept from connector 17 of semiconductor device 60, connector 17 of semiconductor device 60 can be arranged close to signal issuing unit 41 on the system side. Therefore, the flux leakage can be reduced so that the drive signal can be transmitted to semiconductor element 13 more reliably. Therefore, the reliability of transmitting the drive signal to semiconductor element 13 can be improved.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
a semiconductor element having a power device of a voltage drive type configured to control an on operation and an off operation of a main current by input of a drive signal; and
a drive signal terminal configured to receive a drive signal directly from an external issuing unit without making contact with the external issuing unit that issues said drive signal, and configured to transmit said drive signal to said semiconductor element.

2. A semiconductor device, comprising:
a semiconductor element having a power device of a voltage drive type configured to control an on operation and an off operation of a main current by input of a drive signal;
a drive signal terminal configured to receive a drive signal without making contact with an external issuing unit that issues said drive signal, and configured to transmit said drive signal to said semiconductor element; and
a control unit configured to convert said drive signal received by said drive signal terminal into a voltage value and configured to transmit said voltage value to said semiconductor element.

3. A semiconductor device, comprising:
a semiconductor element having a power device of a voltage drive type configured to control an on operation and an off operation of a main current by input of a drive signal; and
a drive signal terminal configured to receive a drive signal by electromagnetic induction without making contact with an external issuing unit that issues said drive signal, and configured to transmit said drive signal to said semiconductor element.

4. A semiconductor device, further comprising:
a semiconductor element having a power device of a voltage drive type configured to control an on operation and an off operation of a main current by input of a drive signal;
a drive signal terminal configured to receive a drive signal without making contact with an external issuing unit that issues said drive signal, and configured to transmit said drive signal to said semiconductor element; and
a metal member arranged around a periphery of said drive signal terminal.

5. A semiconductor device, comprising:
a semiconductor element having a power device of a voltage drive type configured to control an on operation and an off operation of a main current by input of a drive signal;
a drive signal terminal configured to receive a drive signal without making contact with an external issuing unit that issues said drive signal, and configured to transmit said drive signal to said semiconductor element; and
an electrode electrically connected to said semiconductor element configured to pass the main current, wherein
an upper surface of said drive signal terminal is flush with an upper surface of said electrode.

6. A semiconductor device, comprising:
a semiconductor element having a power device of a voltage drive type configured to control an on operation and an off operation of a main current by input of a drive signal;
a drive signal terminal configured to receive a drive signal without making contact with an external issuing unit that issues said drive signal, and configured to transmit said drive signal to said semiconductor element; and
an electrode electrically connected to said semiconductor element configured to pass the main current, wherein
an upper surface of said drive signal terminal is located lower than said electrode.

* * * * *